(12) United States Patent
Nakai et al.

(10) Patent No.: US 6,474,987 B1
(45) Date of Patent: Nov. 5, 2002

(54) WAFER HOLDER

(75) Inventors: Tetsuya Nakai, Tokyo (JP); Katsuo Arai, Saitama (JP); Makoto Shinohara, Kanagawa (JP); Fumitomo Kawahara, Okayama (JP); Makoto Saito, Okayama (JP); Yasuhiko Kawamura, Okayama (JP)

(73) Assignees: Mitsubishi Materials Silicon Corporation, Tokyo (JP); Mitsu Engineering & Ship Building Co., Ltd., Tokyo (JP); Shinku Giken Co., Ltd., Kanagawa (JP)

( * ) Notice: Subject to any disclaimer, the term of this patent is extended or adjusted under 35 U.S.C. 154(b) by 0 days.

(21) Appl. No.: 09/831,032

(22) PCT Filed: Aug. 29, 2000

(86) PCT No.: PCT/JP00/05818

§ 371 (c)(1),
(2), (4) Date: Jul. 9, 2001

(87) PCT Pub. No.: WO01/18856

PCT Pub. Date: Mar. 15, 2001

(30) Foreign Application Priority Data

Sep. 3, 1999 (JP) .......................................... 11-249480
May 30, 2000 (JP) ....................................... 2000-160033

(51) Int. Cl.[7] ............................................... F27D 5/00
(52) U.S. Cl. .................................... 432/258; 211/41.18
(58) Field of Search ............................... 432/253, 258, 432/259; 211/41.18; 206/454

(56) References Cited

U.S. PATENT DOCUMENTS

| | | | | |
|---|---|---|---|---|
| 5,709,543 A | * | 1/1998 | Shimazu | 432/253 |
| 5,921,773 A | * | 7/1999 | Lee | 432/258 |
| 6,099,302 A | * | 8/2000 | Hong et al. | 432/258 |

* cited by examiner

Primary Examiner—Gregory Wilson
(74) Attorney, Agent, or Firm—Reed Smith LLP

(57) ABSTRACT

A wafer (22) is placed on an upper surface of a holder body (23), and the holder body is inserted into a plurality of holder-aimed concave recesses (14) formed on supporters (12) accommodated in a heat treatment furnace such that the holder body is held horizontally. The holder body is formed into a disk shape free of recessed cut portions, and the holder body is formed with an upwardly projecting ring-like projection (24) extending in the circumferential direction of the holder body around the axis of the holder body. The wafer holder is constituted such that the wafer is placed on the holder body while contacting with the upper surface of the projection, and such that the outer diameter of the projection is formed to be in a range of 0.5D to 0.98D wherein D is the diameter of the wafer, so that the outer periphery of the wafer is kept from contacting with the projection.

Occurrence of slips in the wafer is restricted by preventing warpage of the holder body upon fabricating the holder body. Further, each of wafers having different diameters is assuredly held by the same holder body without deviating from a relevant predetermined position. Moreover, the working operations for loading and unloading the wafer to and from the holder body are smoothly conducted.

13 Claims, 7 Drawing Sheets

WAFER HOLDER

This application claims priority of Japanese Application Nos. Hei 11-249480 filed Sept. 3, 1999 and 2000-160033 filed May 30, 1999 and International Application No. PCT/JP00/05818 filed Aug. 29, 2000, the complete disclosure of which are hereby incorporated by reference.

TECHNICAL FIELD

The present invention relates to a wafer holder of a silicon wafer suitable for heat treatment of silicon wafers, and particularly suitable for high temperature anneal treatment in fabricating a SIMOX (Separation by IMplanted OXygen) wafer.

BACKGROUND ART

There has been conventionally disclosed a wafer holding apparatus including a plurality of parallelly provided support columns and wafer supporting plates mounted on the support columns, wherein a recessed cut portion is formed in each of the wafer supporting plates where a silicon wafer is loaded (Japanese Patent Application Laid-Open No. HEI-5-114645 (114645/1993)). In this apparatus, the wafer supporting plates are formed of high-melting ceramics such as SiC sintered bodies.

In the thus constructed wafer holding apparatus, wafers are placed on the wafer supporting plates mounted to the columns and are inserted into an electric furnace, so that the contacting areas between the wafer supporting plates and wafers are increased. As a result, loads are not concentrated to a partial area of each wafer, to thereby avoid plastic deformation of wafers upon heat treatment.

Further, forming the recessed cut portion in each wafer supporting plate enables a reduction of the weight of the whole apparatus and allows to move the silicon wafers into and out of the electric furnace such as by pinching the wafers by tweezers.

However, the formation of the recessed cut portion in the wafer supporting plates in the wafer holding apparatus disclosed in the aforementioned Japanese Patent Application Laid-Open No. HEI-5-114645 (114645/1993) brings the supporting plates to be out of point symmetry with respect to the centers of the supporting plates themselves, respectively, so that there is such a possibility that the wafer is warped at the recessed cut portion upon fabricating the supporting plate. Also, there is such a possibility that the silicon wafer is contacted with the edges of the recessed cut portion when the silicon wafer is placed on the wafer supporting plate, to thereby cause crystal defects called "slips" within crystals of the wafer such as due to thermal stresses upon heat treatment.

To overcome this problem, there has been disclosed a vertical semiconductor diffusion furnace aimed jig, in which the jig includes ring-shaped wafer supporting bodies made of silicon carbide substance removably mounted to columns provided between an upper plate and a lower plate (Japanese Patent Application Laid-Open No. HEI-6-163440 (163440/1994)). This jig is constituted to horizontally support peripheries of wafers by the wafer supporting bodies, respectively.

In the thus constituted vertical semiconductor diffusion furnace aimed jig, the wafer supporting bodies are uniformly arranged relative to outer peripheries of wafers and the areas of the wafer supporting bodies are increased, to thereby allow to decrease the unit surface pressure acting on the wafer supporting bodies and to disperse loads thereto. As a result, it becomes possible to avoid occurrence of slips in wafers.

However, in the conventional vertical semiconductor diffusion furnace aimed jig disclosed in the Japanese Patent Application Laid-Open No. HEI-6-163440 (163440/1994), it is difficult to evenly hold wafers at the outer peripheries thereof due to the affection of surface-pendant drops at the outer peripheral portions of wafers when the outer peripheries of wafers contact with the wafer supporting bodies, leading to a possibility of occurrence of slips in wafers.

It is therefore a first object of the present invention to provide a wafer holder capable of restricting occurrence of slips within wafers, by preventing warpage of a holder body upon fabricating the holder body.

It is a second object of the present invention to provide a wafer holder capable of restricting occurrence of slips within wafers, by inhibiting contact of an outer periphery of a wafer with the holder body.

It is a third object of the present invention to provide a wafer holder capable of assuredly holding each of wafers having different diameters without deviating them from pertinent predetermined positions, by the same holder body.

It is a fourth object of the present invention to provide a wafer holder capable of smoothly conducting working operations for loading and unloading the wafer to and from the holder body.

DISCLOSURE OF THE INVENTION

As shown in FIGS. 1 through 3, the invention according to claim 1 is an improvement in a wafer holder comprising a holder body 23 for carrying thereon a wafer 22, the holder body 23 being adapted to be inserted into a plurality of holder-aimed concave recesses 14 formed on supporters 12 accommodated in a heat treatment furnace 10 such that the holder body 23 is held horizontally.

The wafer holder is characterized in: that the holder body 23 is formed into a disk shape free of recessed cut portions; that the holder body 23 is formed with an upwardly projecting ring-like projection 24 extending in the circumferential direction of the holder body 23 around the axis of the holder body 23; that the wafer holder is constituted such that the wafer 22 is to be contacted with the upper surface of the projection 24 and is to be placed on the holder body 23, and that the wafer holder is constituted such that the outer diameter of the projection 24 is formed to be in a range of 0.5D to 0.98D wherein D is a diameter of the wafer 22, and such that the outer periphery of the wafer 22 is kept from contacting with the projection 24.

According to the wafer holder recited in claim 1, the holder body 23 is formed into the disk shape free of recessed cut portions, i.e., the holder body 23 is formed in a point symmetric manner with respect to the axis of the holder body 23, so that no warpage is caused in the holder body 23 even upon fabricating the same. As a result, each wafer 22 evenly contacts with the upper surface of the projection 24 such that substantially no internal stresses are caused within the wafer 22. Further, the outer periphery of the wafer 22 is not contacted with the holder body 23 and it is possible to evenly hold the wafer 22 without the affection of surface-pendant drops of the outer peripheral portion of the wafer 22, so that no slips are caused within the wafer 22.

In the present specification, it is noted here that the term "recessed cut portion" means a notch or cutout reaching the vicinity of the center of the holder body, and such a term never embraces those recesses formed at slight depths at the outer periphery of the holder body. In other words, the term "recessed cut portion" used in the above never embraces those recesses which are small to such an extent not to cause warpage in the holder body upon fabricating the holder body as used in the present specification.

The invention of claim 2 as shown in FIGS. 1 and 5 is the invention according to claim 1, and is characterized in that the holder body 23 is formed, at the outer periphery thereof, with a convex ring 26 projecting upwardly; that the holder body 23 is formed, inside the convex ring 26, with a plurality of projections 24a, 24b having different diameters, and that the plurality of projections 24a, 24b are formed to be lower than the convex ring 26 and to become sequentially lower from the outermost projection 24a toward inner ones whereas the outermost projection 24a is the highest among them.

According to the wafer holder as recited in claim 2, when the wafer 22 having a larger diameter is placed on the holder body 23, this wafer 22 contacts with the upper surface of the outermost projection 24a, and the horizontal displacement of the outer peripheral surface of the wafer 22 is obstructed by the inner peripheral surface of the convex ring 26. Meanwhile, when the wafer 27 having a smaller diameter is placed on the holder body 23, this wafer 27 contacts with the upper surface of the inside projection 24b, and the horizontal displacement of the outer peripheral surface of the wafer 27 is obstructed by the inner peripheral surface of the outermost projection 24a. As a result, it is possible to assuredly hold each of wafers 22, 27 having different diameters on the same holder body 23 without deviating from a relevant predetermined position.

The invention of claim 3 as shown in FIG. 1 is the invention according to claim 1 or 2, characterized in that the upper surface of the projection 24 is flattened.

According to the wafer holder recited in claim 3, since the upper surface of the projection 24 has been flattened, those bumps caused on the upper surface of the projection 24 such as due to grain growth upon CVD treatment have been removed to thereby smoothen the upper surface of the projection 24. As a result, placing the wafer 22 on the projection 24 causes the wafer 22 to be evenly contacted with the upper surface of the projection 24 such that substantially no internal stresses are caused within the wafer 22, i.e., such that the unit surface pressure of the wafer 22 is reduced and the load of the wafer 22 is dispersed, so that no slips are caused within the wafer 22.

The invention of claim 4 as shown in FIG. 1 is the invention according to claim 3, characterized in that the periphery of the upper surface of the projection 24 is chamfered.

According to the wafer holder recited in claim 4, although the peripheries of the upper surface of the projection 24 become sharp edges when such peripheries are flattened, the sharp edges are removed by chamfering the peripheries of the upper surface of the projection 24 after flattening the upper surface of the projection 24. As a result, no slips due to the peripheries of the upper surface of the projection 24 are caused within the wafer 22 even if the wafer 22 is placed on the projection 24.

The invention of claim 5 as shown in FIG. 4 is the invention according to anyone of claims 1 through 4, characterized in that the holder body 23 is formed, at the center thereof, with a through-hole 23a for allowing insertion therethrough of a plunger 28 for rendering the wafer 22 to be placed on and to depart from the holder body 23.

According to the wafer holder recited in claim 5, loosely inserting the plunger 28 into the through-hole 23a of the holder body 23 from the below of the through-hole 23a to thereby place the wafer 22 onto the upper surface of the plunger 28, and lowering the plunger 28 under this condition, causes the wafer 22 to be placed on the holder body 23 and the plunger 28 to depart from the wafer 22. Reversely to this operation, inserting the plunger 28 into the through-hole 23a of the holder body 23 carrying thereon the wafer 22, from the below of the through-hole 23a, causes the wafer 22 to depart from the holder body 23 and to be placed on the upper surface of the plunger 28. In this way, there can be relatively smoothly conducted the operations for loading and unloading the wafer 22 onto and from the holder body 23.

The invention of claim 6 as shown in FIGS. 6 and 7 is the invention according to anyone of claims 2 through 4, characterized in that the height H of the projection 74 is formed to be 2.0 to 20 mm, that the convex ring 76 is formed, at a portion thereof, with a fork-aimed recess 76a into which a wafer transporting fork 77 is insertable, and that the bottom wall of the fork-aimed recess 76a is formed to lie in the same plane as the holder body 73 around the convex ring 76.

According to the wafer holder recited in claim 6, when the wafer 22 is to be accommodated into the heat treatment furnace, the wafer 22 is firstly placed on each fork 77 and each fork 77 is moved to thereby transport each wafer 22 to the above of each holder body 73, such that each fork 77 is positioned above the fork-aimed recesses 76a of each holder body 73 and such that the center of each wafer 22 coincides with the center of each holder body 73. Next, lowering the fork 77 causes the wafer 22 to contact with the upper surface of the projection 74, and further lowering the fork 77 results in departure of the fork 77 from the wafer 22. Taking the fork 77 out of the fork-aimed recesses 76a under this condition causes each wafer holder 63 carrying thereon each wafer 22 to be accommodated in the heat treatment furnace.

Meanwhile, when each wafer 22 is to be taken out of the heat treatment furnace, each fork 77 is firstly inserted into fork-aimed recesses 76a. Next, raising each fork 77 causes the fork 77 to contact with the lower surface of each wafer 22, and further raising each fork 77 causes each wafer 22 to depart from each projection 74 and to be placed on each fork 77. Each fork 77 is drawn out of the heat treatment furnace under this condition, to thereby take each wafer 22 out of the heat treatment furnace.

The invention of claim 7 as shown in FIGS. 8 and 9 is the invention according to anyone of claims 1 through 4, characterized in that the height H of the projection 94 is formed to be 2.0 to 20 mm, that the convex ring 96 and the projection 94 are formed, at portions of the convex ring 96 and projection 94, respectively, with a plurality of fork-aimed recesses 96a, 93a, 93b into which a wafer transporting fork 97 if insertable, and that the bottom walls of the fork-aimed recesses 96a, 93a, 93b are formed to lie in the same plane as the holder body 93 around the convex ring 96 and the projection 94.

According to the wafer holder recited in claim 7, when the wafer 27 is to be accommodated into the heat treatment furnace, each wafer 27 is firstly placed on each wafer transporting fork 97, and each fork 97 is moved to thereby transport each wafer 27 to the above of each holder body 93 such that the fork 97 is positioned above the forkaimed recesses 96a, 93a, 93b, 98a of the holder body 93 and the center of each wafer 27 coincides with the center of each holder body 93. Next, lowering each fork 97 causes each wafer 27 to contact with the upper surface of each projection 94, and further lowering the fork 97 causes the fork 97 to depart from each wafer 27. Taking each fork 97 out of the fork-aimed recesses 96a, 93a, 93b under this condition causes the wafer holder 83 carrying thereon the wafer 27 to be accommodated in the heat treatment furnace.

Meanwhile, when each wafer 27 is to be taken out of the heat treatment furnace, each fork 97 is firstly inserted into the fork-aimed recesses 96a, 93a, 93b. Next, raising each fork 97 results in contact of this fork 97 with the lower surface of each wafer 27, and further raising the fork 97 causes the wafer 27 to depart from the projection 94 and to be placed on the fork 97. Each fork 97 is drawn out of the heat treatment furnace under this condition to thereby take each wafer 27 out of the heat treatment furnace.

The invention of claim 8 as shown in FIGS. 10 and 11 is the invention according to claim 7, characterized in that both ends of the projection 94 are chamfered.

According to the wafer holder recited in claim 8, although both ends of the fork-aimed recesses 93a, 93b, i.e., both ends of the projection 94 become sharp edges when the upper surface of the projection 94 is flattened, the sharp edges are eliminated by chamfering the both ends of the projection 94 after flattening the upper surface of the projection 94, so that no slips are caused within the wafer 27 even if the wafer 27 is placed on the projection 94.

BEST MODE FOR CARRYING OUT THE INVENTION

There will be described hereinafter a first embodiment of the present invention, with reference to the accompanying drawings.

Figure 1:
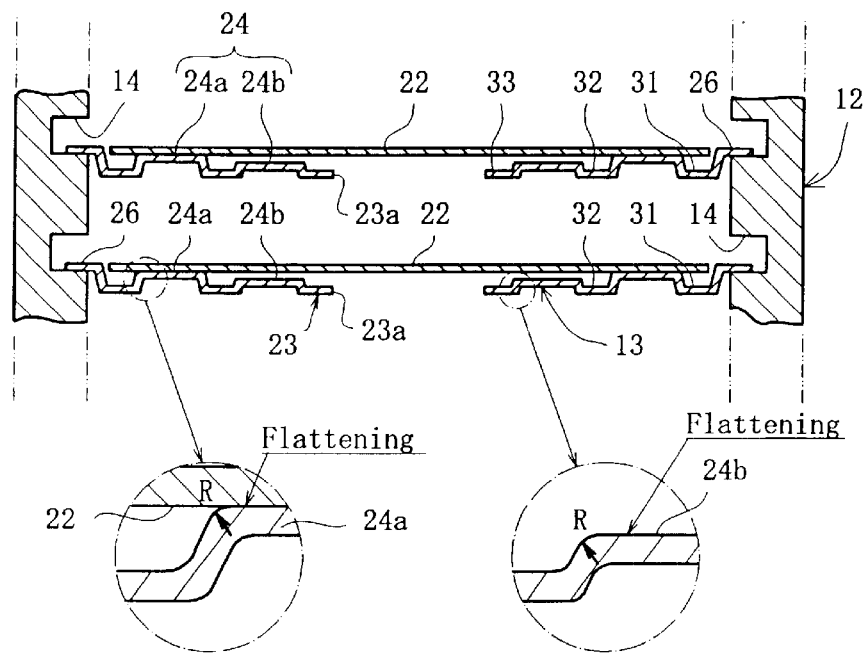
FIG. 1 is a cross-sectional view taken along a line A—A in FIG. 2 including a wafer holder according to a first embodiment of the present invention.
Figure 2:
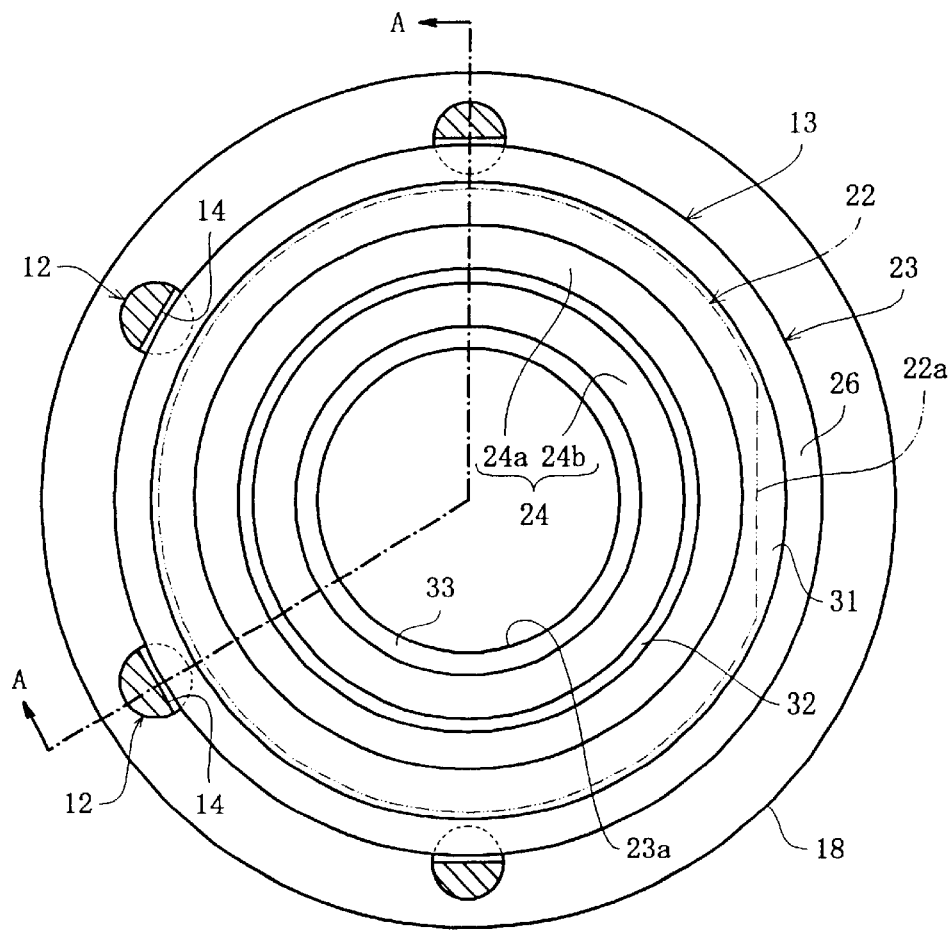
FIG. 2 is a cross-sectional view taken along a line B—B of FIG. 3.
Figure 3:
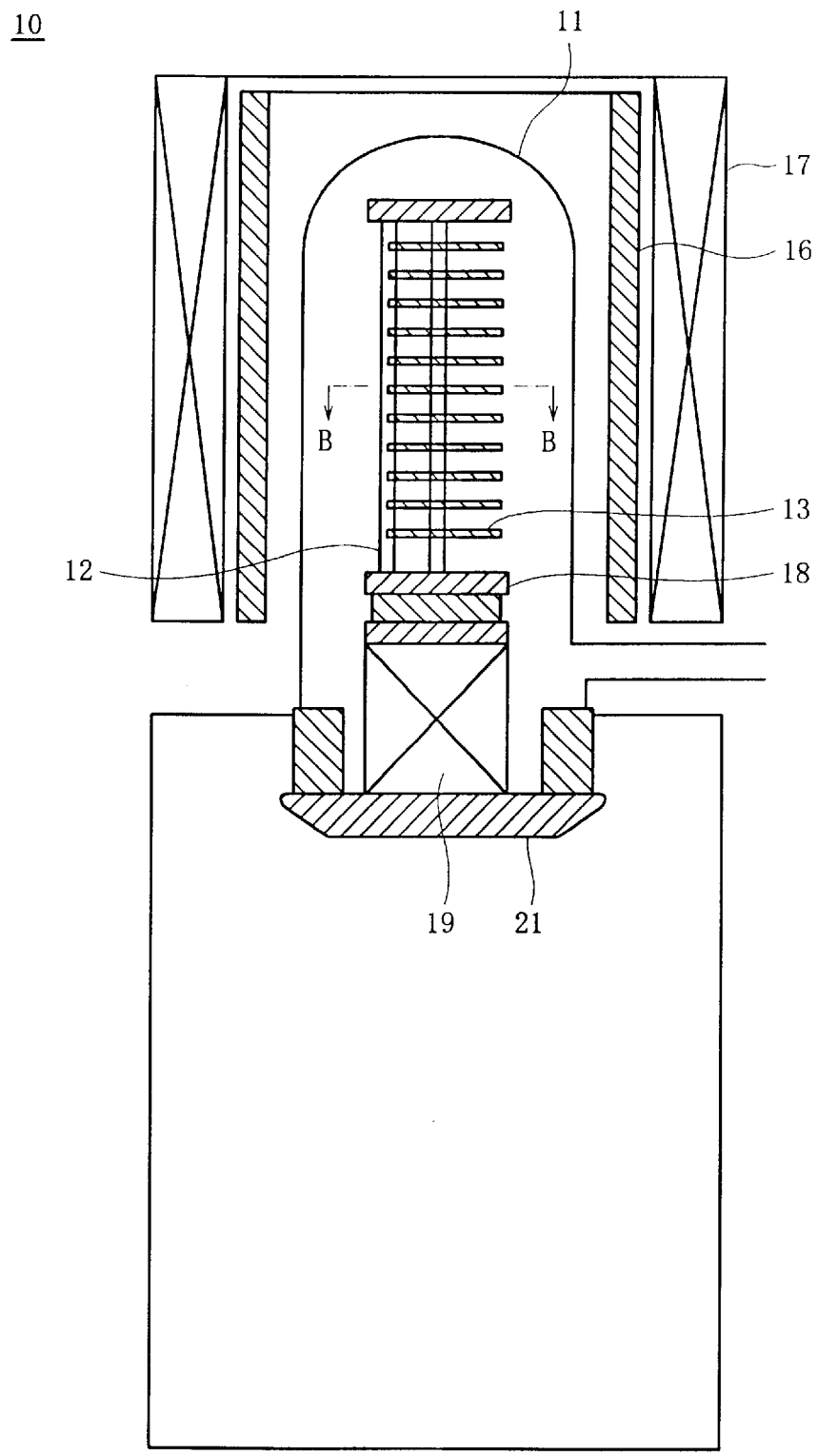
FIG. 3 is a cross-sectional constitution view of a heat treatment furnace including the wafer holder.

As shown in FIGS. 1 through 3, a vertical heat treatment furnace 10 is provided with a vertically extending reaction tube 11 made of SiC. A plurality of rod-like supporters 12 made of SiC are uprightly accommodated in the reaction tube 11 at predetermined intervals. Multiple holder-aimed concave recesses 14 are formed on the plurality of supporters 12 in the longitudinal direction thereof at predetermined intervals so as to loosely receive outer peripheries of wafer holders 13, respectively. The outer peripheral surface of the reaction tube 11 is covered by a cylindrical heater 17 via an evenly-heating tube 16 (FIG. 3). The supporters 12 are upstandingly mounted on a cap 21 via a base 18 and a heat insulating mould 19. The number of supporters 12 is four in this embodiment, and these supporters 12 are equidistantly provided along a semicircle (FIG. 2). These supporters 12 are formed of SiC so as to prevent deformation of the supporters 12 themselves due to high temperatures upon heat treatment and so as to prevent contamination within the reaction tube 11 such as due to occurrence of particles.

Each wafer holder 13 is placed on lower horizontal surfaces of those four holder-aimed concave recesses 14 of the four supporters 12 which recesses reside within the same horizontal plane, and the wafer holder 13 has an upper surface constituted to carry thereon an 8-inch silicon wafer 22 (FIG. 1 and FIG. 2). Each wafer holder 13 includes: a holder body 23 formed into a disk shape free of recessed cut portions; and a plurality of upwardly projecting ring-like projections 24 formed on the holder body 23 so as to extend in the circumferential direction of the holder body 23 around the axis of the holder body 23. Each holder body 23 is formed of SiC.

For example, the holder body 23 is formed into a predetermined shape, by CVD depositing SiC onto a carbon substrate formed in the same shape of the holder body 23 and by burning out the carbon substrate when the deposited SiC reached a predetermined thickness. Further, the upper surfaces of those portions of the holder body 23 which become the projections 24 are smoothened by flattening (such as by surface grinding or surface polishing), and the outer peripheries of the upper surfaces of projections 24 are chamfered after flattening the upper surfaces of the projections 24 (FIG. 1). In the present specification, the term "chamfer" means to provide an intersection corner between one surface and another with a slant surface or radius, and there is provided a radius at an intersection corner between one surface and another in this embodiment. Note, the holder body 23 is formed into the disk shape free of recessed cut portions, i.e., the holder body 23 is formed to be point symmetric with respect to the axis of the holder body 23, so that no warpage is caused in the holder body 23 even upon fabricating the same.

Figure 5:
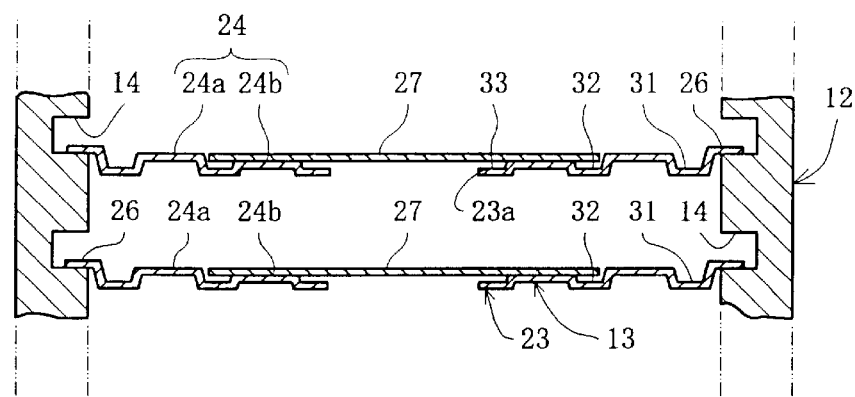
FIG. 5 is a cross-sectional view showing a situation where wafers having smaller diameters are placed on holder bodies, correspondingly to FIG. 1.

Formed at the outer periphery of the holder body 23 is an upwardly projecting convex ring 26 constituted to be placed on the lower horizontal surfaces of those cooperative holder-aimed concave recesses 14 of the supporters 12. The plurality of ring-like projections 24 is formed on the holder body 23 inside the convex ring 26 so as to have different diameters, and these projections 24 are formed to be lower than the convex ring 26 and to become sequentially lower from the outermost projection 24a toward inner ones whereas the outermost projection 24a is the highest among them. In this embodiment, the plurality of ring-like projections 24 comprises a first projection 24a having a larger diameter and a second projection 24b having a smaller diameter, and the upper surface of the first projection 24a is formed to be lower than that of the convex ring 26 and higher than that of the second projection 24b. The holder body 23 is formed with a first concave ring 31 positioned between the convex ring 26 and first projection 24a, and a second concave ring 32 positioned between the first projection 24a and second projection 24b. The convex ring 26 has an inner diameter which is formed to be slightly larger than the outer diameter of the 8-inch silicon wafer 22 (FIG. 1 and FIG. 2), and the first projection 24a has an inner diameter which is formed to be slightly larger than the outer diameter of a 6-inch silicon wafer 27 (FIG. 5). Further, the holder body 23 is centrally formed with a circular through-hole 23a through which a plunger 28 to be described later can be loosely inserted. Reference numeral 33 in FIGS. 1 and 2 designates a third concave ring. Further, reference numeral 22a in FIG. 2 designates an orientation flat which indicates a crystal orientation and is formed at a predetermined position of the outer periphery of the silicon wafer 22.

Supposing the diameter of the wafer to be D, the outer diameters of the projections 24 are formed to be in a range of 0.5D to 0.98D, preferably 0.6D to 0.8D. Concretely, in case of the 8-inch (200 mm) diameter wafer 22, the outer diameter of the first projection 24a is formed to be in a range of 100 to 196 mm, preferably 120 to 160 mm, and in case of the 6-inch (150 mm) diameter wafer 27, the outer diameter of the second projection 24b is formed to be in a range of 75 to 147 mm, and preferably 90 to 120 mm. The reason why the outer diameters of the projections 24 are limited to a range of 0.5D to 0.98D is that: outer diameters smaller than 0.5D lead to narrower widths of the projections when a single holder body is constituted to be capable of holding wafers having different diameters, so that the unit surface pressure exerted on the projection becomes large to thereby cause a possibility of slips within the wafer; and outer diameters exceeding 0.98D may result in that the outer periphery of the wafer contacts with the holder body.

Figure 4:
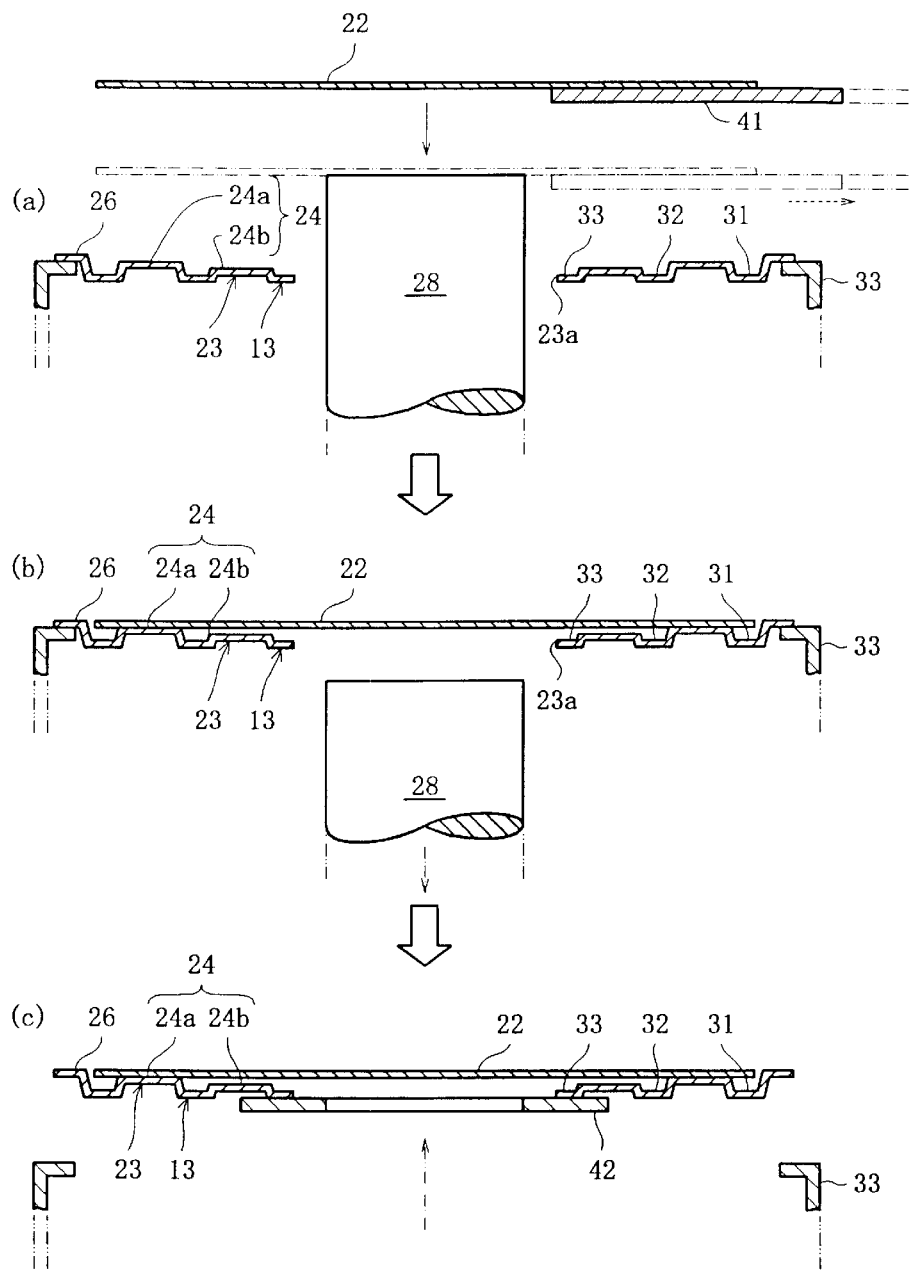
FIG. 4 is a process chart showing a procedure for placing a wafer onto the holder body and for accommodating the wafer into the heat treatment furnace.

There will be explained hereinafter a procedure for placing the 8-inch diameter wafer 22 onto the thus constituted holder body 13 and for accommodating the wafer 22 into the heat treatment furnace 10, with reference to FIG. 4.

Firstly, the holder body 23 is placed on a temporary holder stand 33 installed near the heat treatment furnace 10. In this situation, the upwardly and downwardly movable plunger 28 having a horizontally formed upper surface is raised and loosely inserted into the through-hole 23a from the below (FIG. 4(a)). Next, the wafer 22 before heat treatment is taken out of a wafer cassette (not shown) by a first carriage 41, and placed onto the upper surface of the plunger 28. The upper surface of this first carriage 41 is provided with a plurality of suction holes (not shown) communicated with a vacuum pump, such that contacting the upper surface of the first carriage 41 with the lower surface of the wafer 22 causes the wafer 22 to be tightly sucked onto the first carriage 41 by the suction force of the vacuum pump, whereas switching a valve (not shown) to thereby communicate the suction holes to the atmosphere causes the first carriage 41 to depart from the wafer 22. Namely, by communicating the suction holes to the atmosphere by switching the valve (not shown) after lowering the wafer 22 onto the plunger 28 in the direction shown by a solid line arrow in FIG. 4(a) (to the position indicated by a two-dot chain line in FIG. 4(a)), the first carriage 41 is separated from the wafer 22 while placing the wafer 22 on the plunger 28, by moving the first carriage 41 in the direction indicated by a broken line arrow.

Next, lowering the plunger 28 in the direction indicated by a dashed line arrow in FIG. 4(b) causes the wafer 22 to be placed on the holder body 23 under a condition contacting with the upper surface of the first projection 24a, while further lowering the plunger 28 results in departure of the plunger 28 from the wafer 22. At this time, displacement of the outer periphery of the wafer 22 in the horizontal direction is obstructed by an inner peripheral surface of the convex ring 26. In this situation, bringing the second carriage 42 from the below and raising the same causes the holder body 23 to be placed on the second carriage 42, and further raising the second carriage 42 in the direction indicated by a two-dot chain line arrow of FIG. 4(c) causes the holder body 23 to depart from the temporary holder stand 33. The wafer holder 13 together with the silicon wafer 22 are further transported up to the supporters 12 by the second carriage 42, so as to insert the outer periphery of the holder body 23 into those four holder-aimed concave recesses 14 of the supporters 12 which recesses reside within the same horizontal plane, to thereby place the holder body 23 onto the lower horizontal surfaces of these holder-aimed concave recesses 14. Inserting these wafer holders 13 into the reaction tube 11 such as together with the supporters 12 completes the accommodating operation of the wafers 22 into the heat treatment furnace 10.

When the heat treatment furnace 10 is operated under the condition that the silicon wafers 22 are accommodated in the heat treatment furnace 10, the temperature within the heat treatment furnace 10 is raised by the heater 17 up to 1,300° C. or higher. At this time, no warpage is caused in the holder body 23 even when the holder body 23 is heated in the above manner, since the holder body 23 has a disk shape free of recessed cut portions. Further, since the upper surfaces of the first and second projections 24a, 24b have been flattened, those bumps caused on the upper surfaces of the projections 24a, 24b such as due to grain growth upon CVD treatment have been removed to thereby smoothen the upper surfaces of projections 24a, 24b. Further, chamfering the peripheries of the upper surfaces of the projections 24a, 24b after flattening the upper surfaces of the projections 24a, 24b provide radii at the peripheries of the upper surfaces of the projections 24a, 24b. As a result, placing the wafer 22 on the first projection 24a causes the wafer 22 to be evenly contacted with the upper surface of the first projection 24a such that substantially no internal stresses are caused within the wafer 22, i.e., such that the unit surface pressure of the wafer 22 is reduced and the load of the wafer 22 is dispersed, so that no slips are caused within the wafer 22. Further, the outer periphery of the wafer 22 is not contacted with the holder body 23 and it is possible to evenly hold the wafer 22 without the affection of surface-pendant drops of the outer peripheral portion of the wafer 22, so that no slips are caused within the wafer 22.

Upon completion of the heat treatment of each wafer 22 within the heat treatment furnace 10, each holder body 23 together with the supporters 12 is taken out of the heat treatment furnace 10 by the procedure reverse to the above and is placed on the temporary holder stand 33, and the wafer 22 is brought back into the wafer cassette.

Although the 8-inch diameter wafer 22 has been placed on the holder body 23 in this embodiment, it is possible to place a 6-inch diameter wafer 27 as shown in FIG. 5. In this situation, the 6-inch diameter wafer 27 is placed onto the holder body 23 by contacting with the upper surface of the second projection 24b which is lower than the first projection 24a, and the inner diameter of the first projection 24a is slightly larger than the outer diameter of the wafer 27, so that the displacement of the wafer 27 in the horizontal direction is obstructed by the inner peripheral surface of the first projection 24a. As a result, the 6-inch diameter wafer 27 is held in a state positioned at the center of the holder body 23.

Figure 6:
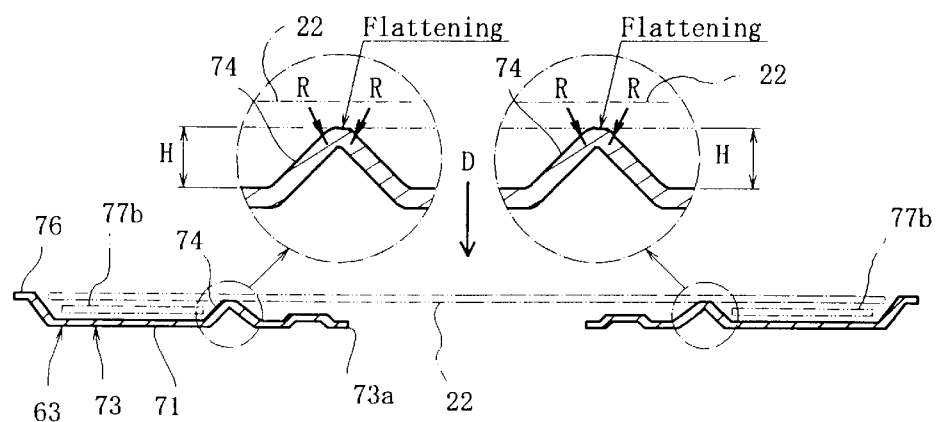
FIG. 6 is a cross-sectional view taken along a line C—C in FIG. 7 showing a holder body according to a second embodiment of the present invention.
Figure 7:
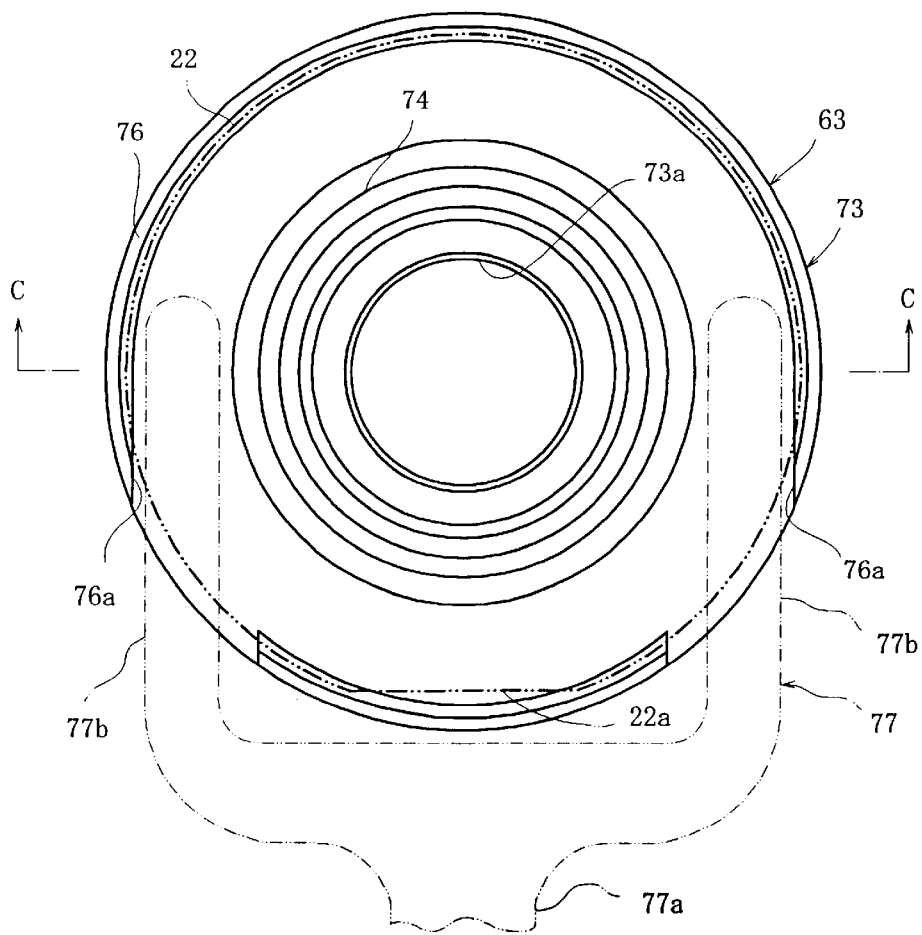
FIG. 7 is an arrow D view of FIG. 6.

FIGS. 6 and 7 show a second embodiment of the present invention. Like reference numerals as used in FIGS. 1 and 2 are used to denote corresponding elements in FIGS. 6 and 7.

In this embodiment, the height H of a projection 74 formed on a holder body 73 is formed to be 2.0 to 20 mm, preferably 3 to 10 mm, a convex ring 76 has portions formed with fork-aimed recesses 76a, 76a into which a wafer transporting fork 77 is insertable, and these fork-aimed recesses 76a, 76a have bottom walls formed to reside in the same plane as the holder body 73 around the convex ring 76. This holder body 73 is dedicated to carry thereon the 8-inch diameter silicon wafer 22, and the projection 74 is formed to have a substantially angled cross section. The reason why the height H of the projection 74 is limited to a range of 2.0 to 20 mm is that: heights less than 2.0 mm lead to a possibility that the fork 77 contacts with the wafer 22 or holder body 73 when the fork 77 is loosely inserted into or taken out of the fork-aimed recesses 76a, 76a; and heights exceeding 20 mm lead to excessively increased distances between holder bodies 73 inserted into holder-aimed concave recesses (not shown) to thereby reduce the number of wafers 22 to be accommodated in the heat treatment furnace (not shown). Note, the upper surface of the projection 74 is flattened (such as by surface grinding or surface polishing), and the periphery of the upper surface of the projection 74 is chamfered after flattening (FIG. 6).

The fork 77 includes a base 77a and a pair of receiving portions 77b, 77b bifurcated from the tip of the base 77a. The pair of receiving portions 77b, 77b have upper surfaces formed with a plurality of suction holes (not shown) communicated with a vacuum pump (not shown), similarly to the first embodiment. These suction holes are provided: to tightly suck the silicon wafer 22 onto the pair of receiving portions 77b, 77b by the suction force of the vacuum pump when the upper surfaces of the pair of receiving portions 77b, 77b are contacted with the lower surface of the silicon wafer 22; and to cause the pair of receiving portions 77b, 77b to readily depart from the wafer 22 upon switching a valve (not shown) to thereby communicate the suction holes to the atmosphere.

Further, the convex ring 76 is formed to upwardly project at the outer periphery of the holder body 73, and the number of the fork-aimed recesses 76a, 76a formed in the convex ring 76 is two. Concretely, the two fork-aimed recesses 76a, 76a are formed to be separated from each other by the same distance as the distance between the pair of receiving portions 77b, 77b, and to be slightly wider than the widths of the pair of receiving portions 77b, 77b, respectively. The holder body 73 is formed with a first concave ring 71 between the convex ring 76 and the projection 74, and the bottom wall of the fork-aimed recess 76a is formed to reside in the same plane as the first concave ring 71. Note, reference numeral 73a in FIGS. 6 and 7 designates a circular through-hole formed at the center of the holder body 73. The constitution other than the above is the same as the aforementioned first embodiment.

There will be explained hereinafter a procedure for placing the 8-inch diameter silicon wafer 22 onto the thus constituted wafer holder 63 and for accommodating the wafer 22 into the heat treatment furnace.

Each holder body 73 shall be previously placed on lower horizontal surfaces of holder-aimed concave recesses, by inserting the outer periphery of the holder body 73 into four holder-aimed concave recesses (not shown) within the same horizontal plane of the supporters (not shown). Firstly, the vacuum pump is operated and the suction holes of the pair of receiving portions 77b, 77b are communicated with the vacuum pump, and each wafer 22 within the wafer cassette (not shown) is placed onto each pair of receiving portions 77b, 77b. Each fork 77 is moved under this condition to thereby transport each wafer 22 to the above of each holder body 73, such that the pair of receiving portions 77b, 77b are positioned above the two fork-aimed recesses 76a, 76a of each holder body 73, respectively, and such that the center of each wafer 22 coincides with the center of each holder body 73. Next, lowering the fork 77 after communicating the suction holes of the pair of receiving portions 77b, 77b with the atmosphere causes the wafer 22 to contact with the upper surface of the projection 74, and further lowering the fork 77 causes the pair of receiving portions 77b, 77b to depart from the projection 74. By taking the pair of receiving portions 77b, 77b out of the fork-aimed recesses 76a, 76a under this condition and by inserting the wafer holder 63 such as together with the supporters into the reaction tube (not shown), there is completed the accommodating operation of the silicon wafers 22 into the heat treatment furnace.

Operating the heat treatment furnace under the condition that each silicon wafer 22 is accommodated in the heat treatment furnace causes the wafer 22 to evenly contact with the upper surface of the projection 74 similarly to the first embodiment, so that substantially no internal stresses occur in the wafer 22, thereby allowing to restrict occurrence of slips within the wafer 22.

Meanwhile, upon completion of the heat treatment of the wafer 22 within the heat treatment furnace, each wafer holder 63 is firstly taken out of the heat treatment furnace such as together with the supporters, and then the pair of receiving portions 77b, 77b are inserted into the two fork-aimed recesses 76a, 76a, respectively, under the condition that the vacuum pump is operated and the suction holes of the pair of receiving portions 77b, 77b are communicated with the vacuum pump. Next, raising each fork 77 causes the pair of receiving portions 77b, 77b to contact with the lower surface of each wafer 22, and further raising the fork 77 causes the wafer 22 to depart from the projection 74 and to be placed on the pair of receiving portions 77b, 77b. Under this condition, each fork 77 is horizontally moved in the direction to take out the pair of receiving portions 77b, 77b. Further moving each fork 77 to thereby accommodate each wafer 22 into the wafer cassette completes the take-out operation of the wafers 22 from the heat treatment furnace. In this way, the accommodating operation and the take-out operation of the wafers 22 into and from the heat treatment furnace can be conducted faster and more smoothly than the first embodiment.

FIGS. 8 through 11 show a third embodiment of the present invention.

In this embodiment, the lower one 94b of first and second projections 94a, 94b formed on a holder body 93 is formed to have its height H of 2.0 to 20 mm, preferably 3 to 10 mm, a plurality of fork-aimed recesses 96a, 93a, 93b are formed at portions of a convex ring 96 and projections 94 into which a wafer transporting fork 97 is insertable, and the bottom walls of these fork-aimed recesses 96a, 93a, 93b are formed to lie in the same plane as the holder body 93 around the convex ring 96 and projections 94. This holder body 93 is constituted to carry thereon either of the 8-inch diameter silicon wafer (not shown) and the 6-inch diameter silicon wafer 27. Further, the convex ring 96 is formed to upwardly project at the outer periphery of the holder body 93. The first and second projections 94a, 94b are formed to be lower than the convex ring 96, and the inner second projection 94b is formed to be lower than the outer first projection 94a. Formed inside the second projection 94b is a convex rib 98 lower than the second projection 94b.

Figure 8:
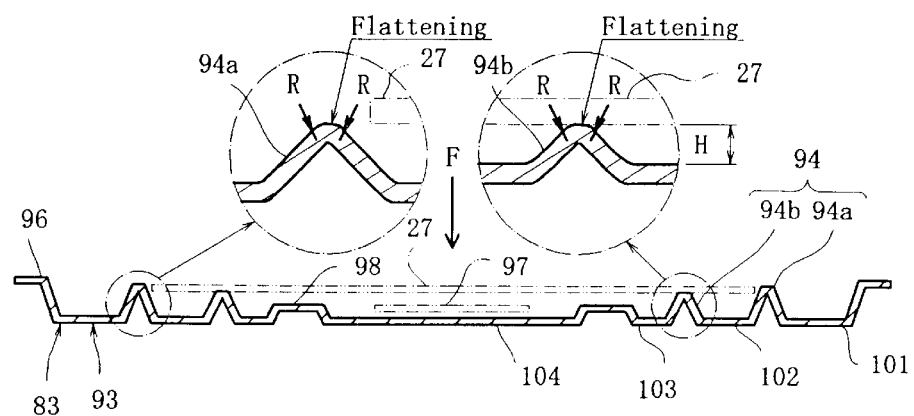
FIG. 8 is a cross-sectional view taken along a line E—E in FIG. 9 showing a holder body according to a third embodiment of the present invention.
Figure 9:
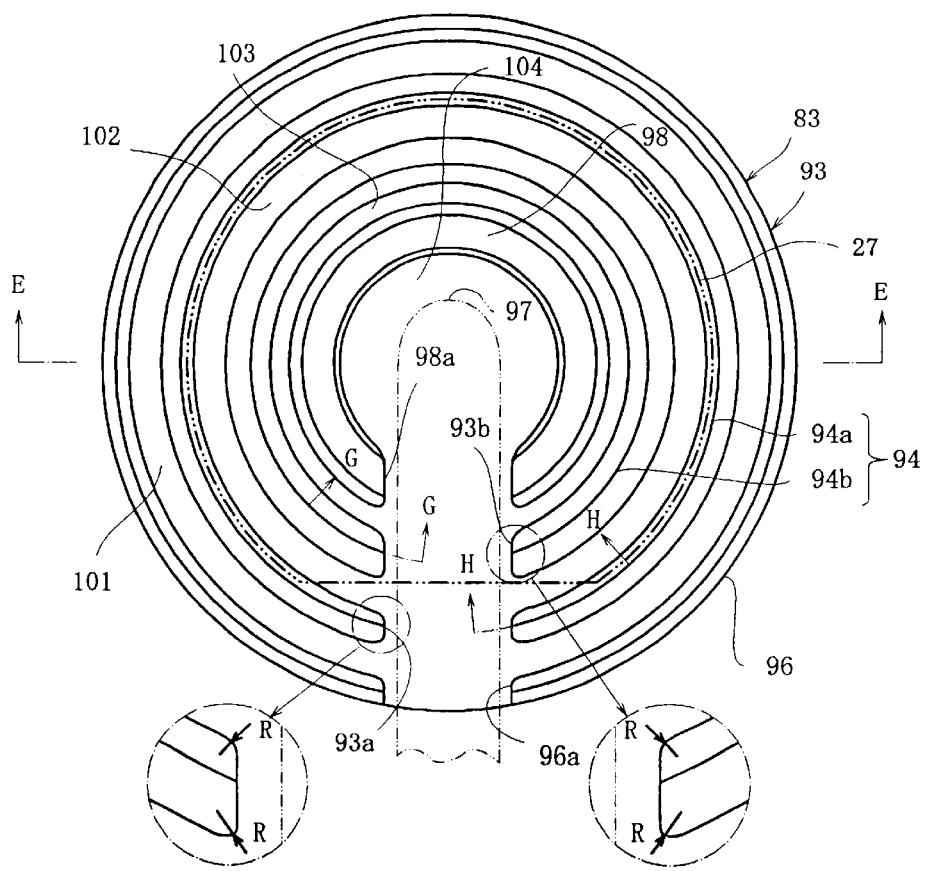
FIG. 9 is an arrow F view of FIG. 8.

The convex ring 96 has its inner diameter formed to be slightly larger than the outer diameter of an 8-inch silicon wafer (not shown), and the inner diameter of the first projection 94a near its upper end is formed to be slightly larger than the outer diameter of the 6-inch diameter silicon wafer 27. The first and second projections 94a, 94b are constituted to carry thereon the 8-inch wafer and the 6-inch diameter wafer 27, respectively. These projections 94a, 94b are formed to have substantially angled cross sections, respectively. The reason why the height H of the second projection 94b is limited to a range of 2.0 to 20 mm is that: heights less than 2.0 mm cause a possibility that the fork 97 contacts with the wafer 27 or holder body 93 when the fork 97 is loosely inserted into or taken out of the fork-aimed recesses 96a, 93a, 93b; and heights exceeding 20 mm lead to excessively increased distances between holder bodies 93 inserted into holder-aimed concave recesses (not shown) to thereby reduce the number of pieces of wafers 27 to be accommodated in the heat treatment furnace (not shown). Note, the upper surfaces of the projections 94 are flattened (such as by surface grinding or surface polishing), and the peripheries of the upper surfaces of the projections 94 are chamfered after flattening (FIG. 8).

The fork 97 is formed into a straightly extending plate shape, and is provided with a plurality of suction holes (not shown) communicated with the vacuum pump (not shown) at an upper surface near a tip of the fork 97 similarly to the first embodiment. These suction holes are provided: to tightly suck the wafer 27 onto the fork 97 by the suction force of the vacuum pump when the upper surface of the fork 97 is contacted with the lower surface of the silicon wafer 27; and to cause the fork 97 to readily depart from the wafer 27 upon switching a valve (not shown) to thereby communicate the suction holes to the atmosphere.

Figure 10:
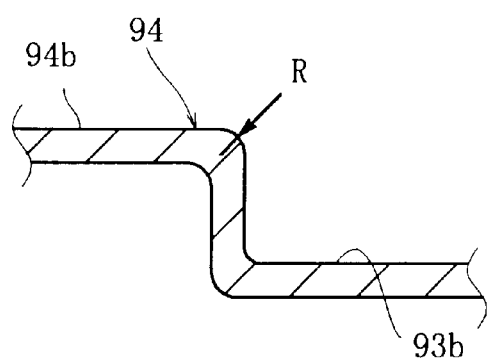
FIG. 10 is a cross-sectional view taken along a line G—G of FIG. 9.
Figure 11:
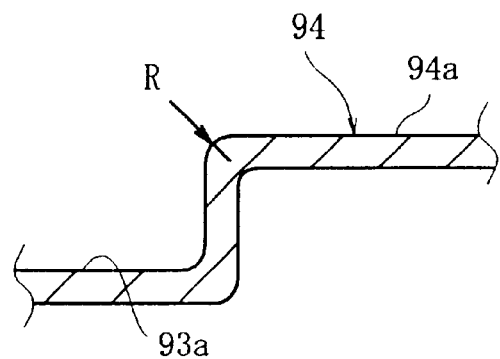
FIG. 11 is a cross-sectional view taken along a line H—H of FIG. 9.

Meanwhile, the fork-aimed recess 98a is formed at a portion of the convex rib 98, in addition to portions of the convex ring 96, first projection 94a and second projection 94b. These fork-aimed recesses 96a, 93a, 93b, 98a are formed to be linearly aligned in the radial direction from the center of the holder body 93 and to be slightly wider than the width of the fork 97. The holder body 93 is formed with a first concave ring 101 positioned between the convex ring 96 and the first projection 94a, a second concave ring 102 positioned between the first projection 94a and the second projection 94b, a third concave ring 103 positioned between the second projection 94b and the convex rib 98, and a concave disk 104 positioned inside the convex rib 98, respectively. The first concave ring 101, second concave ring 102, third concave ring 103 and concave disk 104 are formed to lie in the same plane, and also to lie in the same plane as the bottom walls of the fork-aimed recesses 96a, 93a, 93b, 98a. Further, as shown in FIGS. 10 and 11, there are chamfered both ends of the first and second projections 94a, 94b cut out by forming fork-aimed recesses 93a, 93b, i.e., there are chamfered the both ends of the fork-aimed recesses 93a, 93b. The constitution other than the above is the same as the aforementioned first embodiment.

There will be explained hereinafter a procedure for placing the 6-inch diameter silicon wafer 27 onto the thus constituted holder body 83 and for accommodating the wafer into the heat treatment furnace.

Each holder body 93 shall be previously placed on lower horizontal surfaces of holder-aimed concave recesses, by inserting the outer periphery of the holder body 93 into four holder-aimed concave recesses (not shown) within the same horizontal plane of the supporters (not shown). Firstly, the vacuum pump is operated and the suction holes of each fork 97 are communicated with the vacuum pump, and each wafer 27 within the wafer cassette (not shown) is loaded onto each fork 97. Each fork 97 is moved under this condition to thereby transport each wafer 27 to the above of each holder body 93 such that the fork 97 is positioned above the fork-aimed recesses 96a, 93a, 93b, 98a of the holder body 93 and the center of each wafer 27 coincides with the center of each holder body 93. Next, lowering each fork 97 after communicating the suction holes of each fork 97 with the atmosphere causes each silicon wafer 27 to contact with the upper surface of each second projection 94b, and further lowering the fork 97 causes the fork 97 to depart from each wafer 27. Taking each fork 97 out of the fork-aimed recesses 96a, 93a, 93b, 98a under this condition and then inserting each wafer holder 83 such as together with supporters into the reaction tube completes the accommodating operation of the wafers 27 into the heat treatment furnace.

When the heat treatment furnace is operated under the condition that the silicon wafers 27 are accommodated in the heat treatment furnace, the temperature within the heat treatment furnace is raised by the heater (not shown) up to 1,300° C. or higher. At this time, no warpage is caused in the holder body 93 even when the holder body 93 is heated in the above manner, since the holder body 93 has a disk shape free of recessed cut portions. Further, since the upper surfaces of the first and second projections 94a, 94b have been flattened, those bumps caused on the upper surfaces of the projections 94a, 94b such as due to grain growth upon CVD treatment have been removed to thereby smoothen the upper surfaces of projections 94a, 94b. Further, chamfering the peripheries of the upper surfaces of the projections 94a, 94b and the both ends of the projections 94a, 94b (i.e., both ends of the fork-aimed recesses 93a, 93b) after flattening the upper surfaces of the projections 94a, 94b provide radii at the peripheries of the upper surfaces of the projections 94a, 94b and at the both ends of the projections 94a, 94b. As a result, placing the wafer 27 on the second projection 94b causes the wafer 27 to be evenly contacted with the upper surface of the second projection 94b such that substantially no internal stresses are caused in the wafer 27, i.e., such that the unit surface pressure of the wafer 27 is reduced and the load of the wafer 27 is dispersed, so that no slips are caused in the wafer 27. Further, the outer periphery of the wafer 27 is not contacted with the holder body 93 and it is possible to evenly hold the wafer 27 without the affection of surface-pendant drops of the outer peripheral portion of the wafer 27, so that no slips are caused in the wafer 27.

Upon completion of the heat treatment of the wafers 27 within the heat treatment furnace, the wafer holders 83 such as together with supporters are firstly taken out of the heat treatment furnace, and then each fork 97 is inserted into the fork-aimed recesses 96a, 93a, 93b, 98a under the condition that the vacuum pump is operated and the suction holes of the fork 97 are communicated with the vacuum pump. Next, raising each fork 97 results in contact of this fork 97 with the lower surface of each wafer 27, and further raising the fork 97 causes the wafer 27 to depart from the second projection 94b and to be placed on the fork 97. Each fork 97 is drawn into the horizontal direction under this condition. Further moving each fork 97 to accommodate each wafer 27 into the wafer cassette completes the take-out operation of the wafers 27 from the heat treatment furnace. In this way, the accommodating operation and the take-out operation of the wafers 27 into and from the heat treatment furnace can be conducted faster and more smoothly than the first embodiment.

There have been formed two pieces of ring-like projections on the holder body in the first and third embodiments, and there has been formed one piece of ring-like projection on the holder body in the second embodiment. However, it is possible to form three or more pieces of ring-like projections having different diameters.

Further, there have been mentioned silicon wafers as the wafers in the first through third embodiments. However, it is possible to adopt a GaP wafer, GaAs wafer, for example. The outer diameter of a wafer is not limited to 8 inches and 6 inches, and it is possible to adopt a wafer having another outer diameter.

In the wafer holder according to the present invention as described above, the holder body is formed into a disk shape free of recessed cut portions, the holder body is formed with a ring-like projection which extends in the circumferential direction of the holder body around the axis of the holder body and which projects upwardly, and the wafer holder is constituted such that the wafer is to be contacted with the upper surface of the projection and is to be placed on the holder body and such that the outer periphery of the wafer is kept from contacting with the projection. Thus, the holder body becomes point symmetric with respect to the axis of the holder body, and warpage of the holder body upon fabrication of the holder body can be avoided. As a result, each wafer contacts with the upper surface of the projection such that substantially no internal stresses are caused in the wafer to thereby restrict occurrence of slips within the wafer. Further, the outer periphery of the wafer is not contacted with the holder body and it is possible to evenly hold the wafer without the affection of surface-pendant drops of the outer peripheral portion of the wafer, so that no slips are caused in the wafer.

Further, it is possible to assuredly hold each of wafers having different diameters on the same holder body without deviating from a relevant predetermined position, by forming a convex ring upwardly projecting at the outer periphery of the holder body, by forming a plurality of ring-like projections having different diameters on the holder body inside the convex ring, and by forming these ring-like projections to be lower than the convex ring such that these ring-like projections become sequentially lower from the outermost projection toward inner ones whereas the outermost projection is the highest among them.

Further, by flattening the upper surface of the projection, those bumps caused on the upper surface of the projection such as due to grain growth upon CVD treatment are removed to thereby smoothen the upper surface of the projection. As a result, placing a wafer on the projection causes the wafer to be evenly contacted with the upper surface of the projection such that substantially no internal stresses are caused in the wafer, i.e., such that the unit surface pressure of the wafer is reduced and the load of the wafer is dispersed, so that no slips are caused in the wafer.

Chamfering the periphery of the upper surface of the projection after flattening the same removes those sharp edges caused at the periphery of the upper surface of the projection by flattening the same, so that no slips due to the periphery of the upper surface of the projection are caused in the wafer even if the wafer is placed on the projection.

By forming at the center of the holder body a through-hole through which a plunger is loosely inserted, inserting and drawing the plunger into and out of the through-hole allows the wafer to be unloaded from and loaded onto the holder body. As a result, there can be relatively smoothly conducted those operations for loading and unloading the wafer onto and from the holder body.

Further, there can be smoothly conducted those operations for accommodating and taking wafers into and out of the heat treatment furnace within a short time, by forming the height of the projection to be 2.0 to 20 mm, by forming a fork-aimed recess, into which each wafer transporting fork is insertable, at a portion of the convex ring, and by forming the bottom wall of the fork-aimed recess to lie in the same plane as the holder body around the convex ring.

Also, similarly to the above, there can be smoothly conducted those operations for accommodating and taking wafers into and out of the heat treatment furnace within a short time, by forming the height of the projections to be 2.0 to 20 mm, by forming a plurality of fork-aimed recesses, into which each wafer transporting fork is insertable, at portions of the convex ring and projections, and by forming the bottom walls of these fork-aimed recesses to lie in the same plane as the holder body around the convex ring and the projections.

Chamfering the both ends of the projections after flattening the upper surfaces of the projections removes those sharp edges caused at the both ends of the projections by flattening the upper surfaces of the projections, so that no slips are caused in the wafer even if the wafer is placed on the projections.

INDUSTRIAL APPLICABILITY

The wafer holder of the present invention can be utilized for heat treatment of a silicon wafer, and particularly for high temperature anneal treatment upon fabricating a SIMOX wafer.

What is claimed is:

1. A wafer holder comprising a holder body (23, 73) for carrying thereon a wafer (22, 27), said holder body (23, 73) being adapted to be inserted into a plurality of holder-aimed concave recesses (14) formed on supporters (12) accommodated in a heat treatment furnace (10) such that said holder body (23, 73) is held horizontally, wherein:

said holder body (23, 73) is formed into a disk shape free of recessed cut portions, said holder body (23, 73) is formed with an upwardly projecting ring-like projection (24, 74) extending in the circumferential direction of said holder body (23, 73) around the axis of said holder body (23, 73), said wafer holder (23, 73) is constituted such that the wafer (22, 27) is to be contacted with the upper surface of said projection (24, 74) and is to be placed on said holder body (23, 73), said wafer holder (23, 73) is constituted such that the outer diameter of said projection (24, 74) is formed to be in a range of 0.5D to 0.98D wherein D is a diameter of said wafer (22, 27), and such that the outer periphery of said wafer (22, 27) is kept from contacting with said projection (24, 74), and said holder body (23, 73) is formed, at the center thereof, with a through-hole (23a, 73a) for allowing loosely insertion therethrough of a plunger (28) for rendering the wafer (22, 27) to be placed on and to depart from said holder body (23, 73).

2. A wafer holder of claim 1, wherein:

said holder body (23) is formed, at the outer periphery thereof, with a convex ring (26) projecting upwardly, said holder body (23) is formed, inside said convex ring (26), with a plurality of projections (24a, 24b) having different diameters, and all of said plurality of projections (24a, 24b) are formed to be lower than said convex ring (26) and to become sequentially lower from the outermost projection (24a) toward inner ones whereas the outermost projection (24a) is the highest among them.

3. A wafer holder of claim 2,
wherein the upper surface of said projection (24) is flattened.

4. A wafer holder of claim 3,
wherein the periphery of the upper surface of said projection (24) is chamfered.

5. A wafer holder of claim 1,
wherein the upper surface of said projection (24, 74) is flattened.

6. A wafer holder of claim 5,
wherein the periphery of the upper surface of said projection (24, 74) is chamfered.

7. A wafer holder of claim 6, wherein:
said holder body (73) is formed, at the outer periphery thereof, with a convex ring (76) projecting upwardly,
the height H of said projection (74) is formed to be 2.0 to 20 mm,
said convex ring (76) is formed, at a portion thereof, with a fork-aimed recess (76a) into which a wafer transporting fork (77) is insertable, and
the bottom wall of said fork-aimed recess (76a) is formed to lie in the same plane as said holder body (73) around said convex ring (76).

8. A wafer holder of claim 5, wherein:
said holder body (73) is formed, at the outer periphery thereof, with a convex ring (76) projecting upwardly,
the height H of said projection (74) is formed to be 2.0 to 20 mm,
said convex ring (76) is formed, at a portion thereof, with a fork-aimed recess (76a) into which a wafer transporting fork (77) is insertable, and
the bottom wall of said fork-aimed recess (76a) is formed to lie in the same plane as said holder body (73) around said convex ring (76).

9. A wafer holder of claim 1, wherein:
said holder body (73) is formed, at the outer periphery thereof, with a convex ring (76) projecting upwardly,
the height H of said projection (74) is formed to be 2.0 to 20 mm,
said convex ring (76) is formed, at a portion thereof, with a fork-aimed recess (76a) into which a wafer transporting fork (77) is insertable, and
the bottom wall of said fork-aimed recess (76a) is formed to lie in the same plane as said holder body (73) around said convex ring (76).

10. A wafer holder comprising a holder body (93) for carrying thereon a wafer (27), said holder body (93) being adapted to be inserted into a plurality of holder-aimed concave recesses (14) formed on supporters (12) accommodated in a heat treatment furnace (10) such that said holder body (93) is held horizontally, wherein:
said holder body (93) is formed into a disk shape free of recessed cut portions,
said holder body (93) is formed with an upwardly projecting ring-like projection (94) extending in the circumferential direction of said holder body (93) around the axis of said holder body (93),
said wafer holder (93) is constituted such that the wafer (27) is to be contacted with the upper surface of said projection (94) and is to be placed on said holder body (93),
said wafer holder (93) is constituted such that the outer diameter of said projection (94) is formed to be in a range of 0.5D to 0.98D wherein D is a diameter of said wafer (27), and such that the outer periphery of said wafer (27) is kept from contacting with said projection (94),
said holder body (93) is formed, at the outer periphery thereof, with a convex ring (96) projecting upwardly,
the height H of said projection (94) is formed to be 2.0 to 20 mm,
convex ring (96) and said projection (94) are formed, at portions of said convex ring (96) and projection (94), respectively, with a plurality of fork-aimed recesses (96a, 93a, 93b) into which a wafer transporting fork (97) is insertable, and
the bottom walls of said fork-aimed recesses (96a, 93a, 93b) are formed to lie in the same plane as said holder body (93) around said convex ring (96) and said projection (94).

11. A wafer holder of claim 10,
wherein both ends of said projection (94) are chamfered.

12. A wafer holder of claim 11, wherein:
said holder body (93) is formed, inside said convex ring (96), with a plurality of projections (94a, 94b) having different diameters, and
all of said plurality of projections (94a, 94b) are formed to be lower than said convex ring (96) and to become sequentially lower from the outermost projection (94a) toward inner ones whereas the outermost projection (94a) is the highest among them.

13. A wafer holder of claim 10, wherein:
said holder body (93) is formed, inside said convex ring (96), with a plurality of projections (94a, 94b) having different diameters, and
all of said plurality of projections (94a, 94b) are formed to be lower than said convex ring (96) and to become sequentially lower from the outermost projection (94a) toward inner ones whereas the outermost projection (94a) is the highest among them.

* * * * *